(12) United States Patent  (10) Patent No.: US 7,398,490 B2
Wallace  (45) Date of Patent: *Jul. 8, 2008

(54) DIGITAL CIRCUIT LAYOUT TECHNIQUES USING BINARY DECISION DIAGRAM FOR IDENTIFICATION OF INPUT EQUIVALENCE

(76) Inventor: David E Wallace, 3308 Monika La., Hayward, CA (US) 94541

( * ) Notice: Subject to any disclaimer, the term of this patent is extended or adjusted under 35 U.S.C. 154(b) by 128 days.

This patent is subject to a terminal disclaimer.

(21) Appl. No.: 11/330,676

(22) Filed: Jan. 11, 2006

(65) Prior Publication Data

US 2006/0117280 A1  Jun. 1, 2006

Related U.S. Application Data

(63) Continuation of application No. 10/222,429, filed on Aug. 16, 2002, now Pat. No. 7,020,855, which is a continuation of application No. 09/470,540, filed on Dec. 22, 1999, now Pat. No. 6,473,885, which is a continuation-in-part of application No. 09/118,225, filed on Jul. 17, 1998, now Pat. No. 6,360,352.

(51) Int. Cl.
*G06F 17/50* (2006.01)

(52) U.S. Cl. .................. 716/4; 716/2; 716/3; 716/5

(58) Field of Classification Search .............. 716/1–5, 716/11; 714/733, 738, 741
See application file for complete search history.

(56) References Cited

U.S. PATENT DOCUMENTS

| | | |
|---|---|---|
| 5,349,659 A | 9/1994 | Do et al. |
| 5,414,716 A * | 5/1995 | Bershteyn ............ 714/738 |
| 5,436,849 A | 7/1995 | Drumm |
| 5,448,497 A | 9/1995 | Ashar et al. |
| 5,524,082 A | 6/1996 | Horstmann et al. |
| 5,526,276 A | 6/1996 | Cox et al. |
| 5,610,829 A | 3/1997 | Trimberger |
| 5,752,000 A | 5/1998 | McGeer et al. |
| 5,774,369 A | 6/1998 | Horstmann et al. |
| 5,896,401 A * | 4/1999 | Abramovici et al. ....... 714/741 |
| 6,023,566 A | 2/2000 | Belkhale et al. |
| 6,070,261 A * | 5/2000 | Tamarapalli et al. ....... 714/733 |
| 6,086,626 A | 7/2000 | Jain et al. |
| 6,212,669 B1 | 4/2001 | Jain |
| 6,360,352 B2 | 3/2002 | Wallace |

OTHER PUBLICATIONS

Chandrasekhar et al., "Application of Term Rewriting Techniques to Hardware Design Verification", 24th ACM/IEEE Conference Proceedings on Design Automation Conference, pp. 277-282, Jun. 1987.

(Continued)

*Primary Examiner*—Vuthe Siek
(74) *Attorney, Agent, or Firm*—Klarquist Sparkman, LLP

(57) ABSTRACT

A technique for analyzing digital circuits to identify pin swaps is provided for circuit layout and similar tasks in which the circuit is first decomposed into regions. Logic functions of the regions are decomposed into a directed graph of the logic functions. A swap structure is created in accordance with the directed graph to facilitate identification of input equivalences.

20 Claims, 6 Drawing Sheets

OTHER PUBLICATIONS

Perkowski et al., Fast Minimization of Mixed-Polarity AND/XOR Canonical Networks, IEEE 1992 Conference on Computer Design, pp. 33-36.

Cong et al., Exploiting Signal Flow an dLogic Dependcy in Standard Cell Placement, 1995 Design Automation conference, pp. 399-404.

Choy et al., Test Generation with Dynamic Probe Points in High Observability Testing Enironment, IEEE Tranactions on Cmputers, vol. 45, Issue 1, pp. 88-96, Jan. 1996.

Cong et al., An Improved Graph-Based FPGA Technology Mapping algorithm for Delay Optimization, IEEE 1992 International Conference on VLSI in Computers and Processors, pp. 154-158, Apr. 1992.

Wallace, High Level Delay Estimation for Technology-Independent Logic Equations, 1990 IEEE International Conference on Computer Aided Design, pp. 188-191, Nov. 1990.

Prabhu, "A Multi-Level Logic Synthesis and Optimization System", 1989 IEEE Custom Integrated Circuits Conference, pp. 4.1/1-4.1/4, May 1989.

Nagoya et al., Multi-Level Logic Optimization for Large Scale ASICs, 1990 IEEE International Conference on Computer Aided Design, pp. 564-567, Nov. 1990.

Chandrasekhar et al., "Effective Coupling between Logic Synthesis and Layout Tools for Synthesis of Area and Speed-Efficient Circuits", VLSI Design, 1997, vol. 5, No. 2, pp. 125-140.

Brasen et al., Post-Placement Buffer Reoptimization, 1992 IEEE, pp. 156-161.

Bertacco et al., "Boolean Function Representation Based on Disjoint-Support Decompositions", ICCD96, IEEE Computer Society Press, Los Alamitos, CA, USA, Oct. 1996, pp. 27-32.

Bertacco et al., "The Disjunctive Decomposition of Logic Functions", ICCD97, IEEE Computer Society Press, Los Alamitos, CA, USA, Nov. 1997, pp. 78-82.

Chang et al., "Layout Driven Logic Synthesis for FPGAs", DAC94, Jun. 1994, pp. 308-313.

Chong et al., "Don't Care Wires in Logical/Physical Design", International Workshop on Logic Synthesis (IWLSOO), Nov. 1, 1999, pp. 1-9.

Entrena et al., "Sequential Logic Optimization by Redundancy Addition and Removal", ICCAD93, IEEE Computer Society Press, Los Alamitos, CA, USA, Nov. 1993, pp. 310-315.

Heineken et al., "Interconnect Yield Model for Manufacturability Prediction in Synthesis of Standard Cell Based Designs", ICCAD96, IEEE Computer Society Press, Los Alamitos, CA, USA, Nov. 1996, pp. 368-373.

Yusuke Matsunaga, "An Exact and Efficient Algorithm for Disjunctive Decomposition", SASIMI98, Oct. 1998, pp. 44-50.

Moller et al., "Detection of Symmetry of Boolean Functions Represented by ROBDDs", ICCAD93, IEEE Computer Society Press, Los Alamitos, CA, USA, Nov. 1993, pp. 680-684.

Tsai et al., A High Speed Test Pattern Generator for Large Scan Designs, Dept. of E.C.E., University of California, Santa Barbara, CA, USA, no date.

* cited by examiner

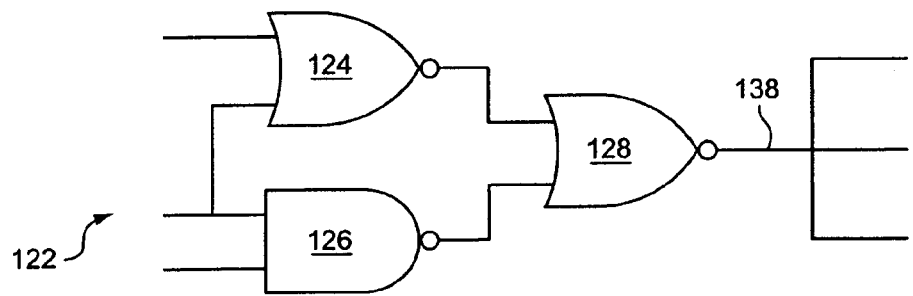
FIG. 6
FIG. 7
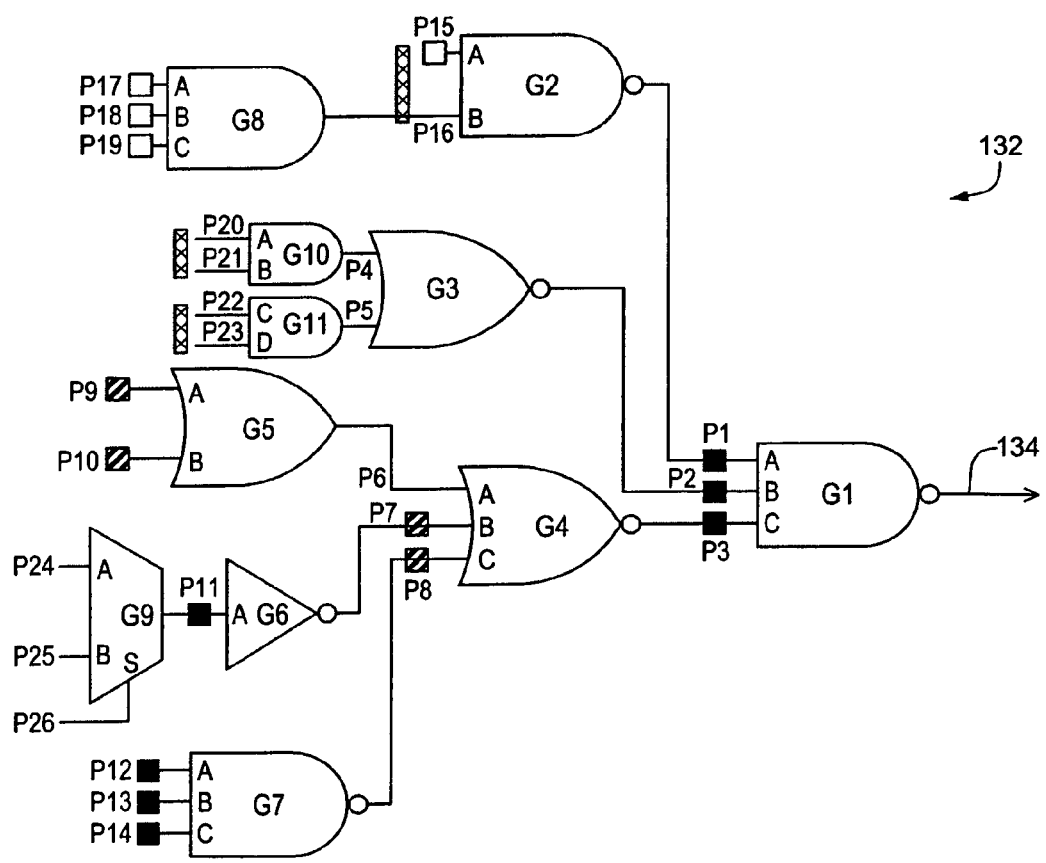

DIGITAL CIRCUIT LAYOUT TECHNIQUES USING BINARY DECISION DIAGRAM FOR IDENTIFICATION OF INPUT EQUIVALENCE

CROSS REFERENCE TO RELATED APPLICATIONS

This application is a Continuation application of 10/222,429, filed on Aug. 16, 2002, now U.S. Pat. No. 7,020,855 entitled "DIGITAL CIRCUIT LAYOUT TECHNIQUES USING IDENTIFICATION OF INPUT EQUIVALENCE", which is a Continuation application of 09/470,540, filed on Dec. 22, 1999, now U.S. Pat. No. 6,473,885, entitled "DIGITAL CIRCUIT LAYOUT TECHNIQUES USING CIRCUIT DECOMPOSITION AND PIN SWAPPING", which is a Continuation-in-part application of 09/118,225, filed on Jul. 17, 1998, now U.S. Pat. No. 6,360,352, issued Mar. 19, 2002, entitled "DIGITAL CIRCUIT LAYOUT TECHNIQUES".

BACKGROUND OF THE INVENTION

1. Field of the Invention

This invention relates to techniques for converting representations of digital circuits, such as logic diagrams or schematics, into layouts for circuit implementation, and more specifically to the identification of logic input equivalences for controlling and optimizing circuit area and circuit delays during the layout process.

2. Description of the Prior Art

Many very sophisticated logic synthesis and layout tools have been developed for producing circuit layouts from circuit and logic diagrams. One recent article, "Effective Coupling between Logic Synthesis and Layout Tools for Synthesis of Area and Speed-Efficient Circuits", Chandrasekhar, McCharles and Wallace, published in VLSI DESIGN, 1997, Vol. 5, No. 2, pp. 125-140, co-authored by the inventor hereof, proposes coupling between logic synthesis and layout tools to improve post-layout circuit implementation.

As noted in that article, many circuits produced by synthesis or other methods contain internal nodes at the outputs of logic gates that implement the same logic function and are therefore logically equivalent. Such nodes are considered output equivalent and techniques are provided for exploiting output equivalents during the layout of digital circuits. Similarly, input equivalence is demonstrated in logic circuits in which the output of an output gate does not change even if the circuit configuration is changed by interchanging the drivers connected to input gates feeding that output gate, as shown in FIG. 8 of that article.

Although techniques are provided for working with output equivalence, what are needed are techniques for identifying and exploiting input equivalences in the synthesis and layout of digital logic circuits.

SUMMARY OF THE INVENTION

The present invention provides improved techniques for identifying input equivalence in digital circuits for use, for example, in swapping pins in order to modify circuit layout. These techniques include the steps of decomposing the circuit into one or more regions, then decomposing the logic function of each region into a directed graph of logic functions, and using the directed graph, identifying pin swap groups and swapping pins as desired for final layout or configuration.

In one embodiment, the present invention decomposes the circuit into fanout free regions (FFRs), and the logic function of each fanout free region is decomposed by generating quasi canonical models for the cells of the circuit. Then, a swap structure is created using these models to form the directed graph, to facilitate identification of input equivalences. The present invention proceeds by looking for extensible symmetric logic functions (such as AND, OR and XOR functions) within and between gates in a logic circuit. Such functions are grown backwards as long as they can continue to be extended and then analyzed to identify input equivalences to identify permutable pins.

In another embodiment, the circuit is decomposed into coalesced regions, where each member of a group of coalesced regions has at most fan out to only one other region. The decomposition of the logic functions of the coalesced regions are accomplished by constructing binary decision diagrams (BDD) for outputs of these regions, and then using the corresponding BDD to construct a ds-prime decomposition for each of the logic function, forming the directed graph. These BDDs are then used to associate nets in the original circuit with the arcs of the directed graph, and compared to identify input equivalences.

The present invention may be conveniently implemented in a computer by coding appropriate software on computer coded media or by any other conventional means of programming a computer. The required software may be written by a person of ordinary skill in the art of developing programs for analyzing digital circuits for layout and similar operations.

These and other features and advantages of this invention will become further apparent from the detailed description and accompanying figures that follow. In the figures and description, numerals indicate the various features of the invention, like numerals referring to like features throughout both the drawings and the description.

BRIEF DESCRIPTION OF THE DRAWINGS

FIG. 6 is a logic schematic of a simple circuit illustrating the properties of fan out free regions.

FIG. 7 is a logic schematic of a more complicated circuit which will be analyzed in accordance with a present invention to permit pin swapping of region configuration of the final layout of the circuit.

DETAILED DESCRIPTION OF THE PREFERRED EMBODIMENT(S)

Figure 1:
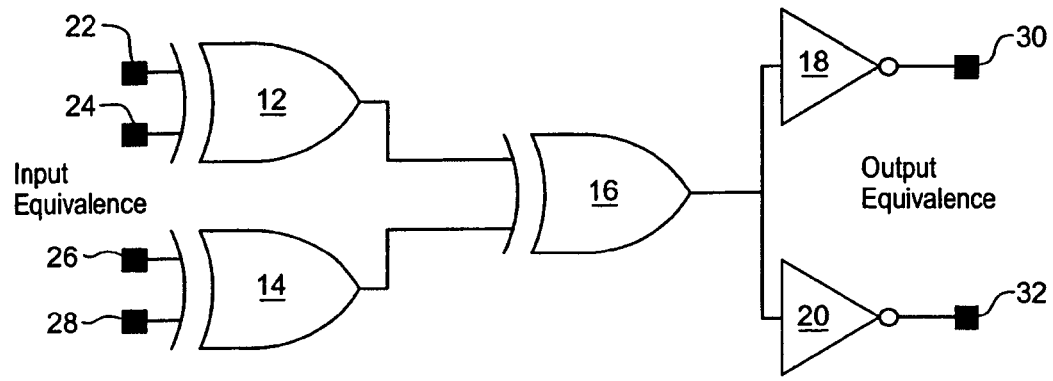
FIG. 1 is a logic schematic of a simple circuit exhibiting both input and output equivalence.

Referring to FIG. 1, digital logic circuit 10 illustrates examples of both input and output equivalence. In digital logic circuit 10, two input XOR gates 12 and 14 are combined in two input XOR gate 16, the output of which is buffered in output buffers 18 and 20. The inputs to XOR gates 12 and 14 are said to exhibit input equivalence in that the output of two input XOR gate 16 does not change if any of the inputs to two input XOR gates 12 and 14 are interchanged. Similarly, the outputs of output buffers 18 and 20 are said to display output equivalence in that the outputs can be exchanged.

In particular, logic equivalence can be said to identify classes of permutable pins; such as input pins 22 and 24 of two input XOR gate 12 and input pins 26 and 28 of two input XOR gate 14 as well as output pins 30 and 32 of output buffers 18 and 20, respectively. That is, such pins can be swapped after placement and/or routing to reduce wire length, improve circuit timing, or reduce routing congestion.

In general, there are two types of logic equivalence: input equivalence, in which inputs to a sub-circuit (such as the inputs to a parity tree) are identified as permutable, and output equivalence, in which permutable output pins of a sub-circuit (such as the outputs of a buffer tree) are identified as permutable. In FIG. 1, input equivalence is said to be evidenced by permutable input pins 22, 24, 26 and 28 while output equivalence is said to be evidenced by permutable output pins 30 and 32.

Input equivalence is a property of pins, while output equivalence can be expressed either as a property of the output pins or of the nets that are driven by them. A given load driven by such a net can equally well be driven by any net that is output equivalent to it without changing the logical function of the circuit, as long as timing and fanout constraints are observed.

The present invention addresses the problem of recognizing input equivalence within a digital logic circuit such as digital logic circuit 10. In general, three types of input equivalence are considered:
1. Single gate, single pin equivalences,
2. Multi-gate, single pin equivalences, and
3. Multi-pin equivalences (whether single or multi-gate).

Single gate, single pin equivalence consists of symmetric inputs to a single logic gate such as a three input NAND gate. Recognition and exploitation of such equivalence has been well-known for years.

Figure 2:
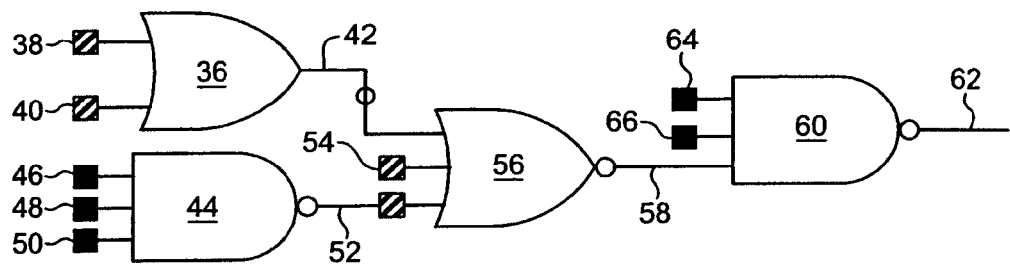
FIG. 2 is a logic schematic of a simple circuit demonstrating multi-gate, single pin (MGSP) equivalence.

Referring now to FIG. 2, circuit 34 is an example of multi-gate, single pin equivalence (MGSP). Two input OR gate 36 receives inputs 38 and 40 to produce output 42. Three input NAND Gate 44 receives inputs 46, 48 and 50 to produce output 52 which is applied, together with output 42 and input 54, to three input NOR gate 56 to produce output 58 Three input NAND gate produces output 62 from output 58 and inputs 64 and 66. In this circuit configuration, pins 38, 40, 52 and 54 form a first group of pins that are permutable, or swappable, while pins 46, 48, 50, 64 and 66 from a second group of permutable pins which may be freely exchanged.

There are some constraints which must be observed, one of which can be called a "Genealogical constraint". For example, an input and output of the same logic function should not be swapped. Viewing a cone of logic as a family tree, a node must never be swapped with one of its ancestors or descendants.

Figure 3:
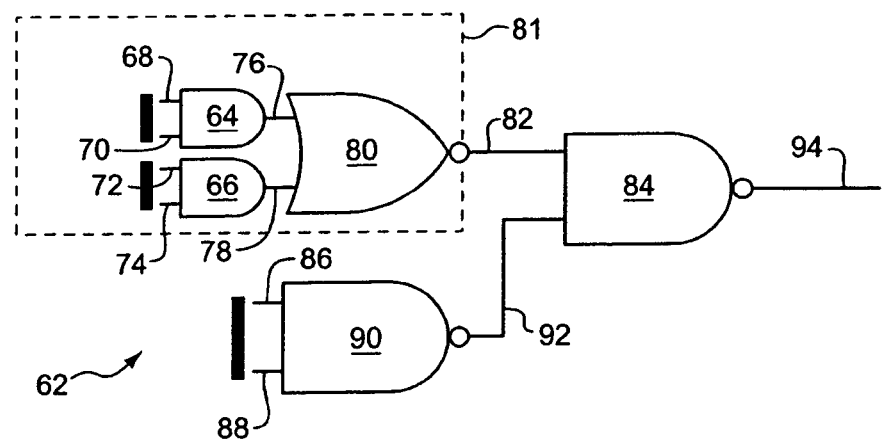
FIG. 3 is a logic schematic of a simple circuit demonstrating multi-pin (MP) equivalence in which groups of two or more pins are found to be equivalent when swapped as a group.

Referring now to FIG. 3, circuit 62 is an example of multi-pin (MP) equivalence in which groups of 2 or more pins are found to be equivalent when swapped as a group. This may occur either on a single gate or across gates. In circuit 62, two input AND gates 64 and 66 receive inputs 68, 70, 72 and 74 and provide outputs 76 and 78, respectively, as inputs to two input NOR gate 80. The output of two input NOR gate 80 is applied as input 82 to two input NAND gate 84. In a preferred physical embodiment of this circuit, gates 80, 64 and 66 are included in a single AND-OR-INVERT GATE, such as GATE 81. Similarly, inputs 86 and 88 are applied to two inputs NAND gate 90 to produce output 92 applied as an input to two input NAND gate 84 to produce circuit output 94.

In this example, input pair 68 and 70 can be swapped with input pair 72 and 74 as well as input pair 86 and 88. Note that this equivalence is based on single-pin equivalences involving the inaccessible or internal pins at the outputs of gates 64 and 66.

Multiple-gate equivalences, such as those shown in FIGS. 2 and 3, offer greater optimization opportunities during physical design than do single-gate equivalences. Proper exploitation of such multi-gate equivalences in physical design swapping of pins can be used to relieve layout problems including resolving problems in wire length, sharing of a single track to relieve density and rerouting of connections. Thus multi-gate pin swaps offer significantly greater opportunities to reduce wire lengths and avoid congestion than the single-gate swaps do.

Multi-gate equivalences also offer greater opportunities to fix timing problems, often discovered during physical design. Single-gate swaps can improve timing by a small amount, by switching a net from a slow pin to a slightly faster pin on the same gate. But multi-gate equivalences can eliminate entire levels of logic from the critical path.

For example, if a net attached to a particular pin was discovered to be much slower than expected (due to placement and routing effects), it could be swapped with a net attached to another pin in order to minimize levels of logic from the critical path. The wire-length reductions that are possible due to multi-gate swaps can also help fix timing problems, by reducing wire capacitance along the critical path.

In order to exploit such equivalences, it is necessary to be able to easily recognize input equivalence. Conventionally, input symmetries in a combinational logic function can be detected in several ways. To determine if a Boolean function $f(\ldots, x, y, \ldots)$ of several variables is symmetric in x and y, a canonical representation of the function (such as a truth table or a binary decision diagram (BDD)) can be built to determine if $f(\ldots, x, y, \ldots) = f(\ldots, y, x,$ Similarly, symmetries can be determined through analysis of the cofactors of the function.

A Boolean function $f(\ldots, x, y, \ldots)$ of several variables is symmetric in x and y if and only if the cofactor with x=1 and y=0 is equal to the cofactor with x=0 and y=1. A variety of heuristic approaches to minimize the effort required in such a computation is described in the literature by Möller, Mohnke and Weber in an article entitled "Detection of Symmetry of Boolean Functions Represented by ROBDDs" published in Proceedings of the IEE/ACM International Conference on Computer Aided Design (ICCAD93), Santa Clara, Calif., November 1993, pp. 680-684.

What these approaches have in common is that they detect symmetries along a fixed input boundary. This is perfectly acceptable for applications where such a boundary is given, such as detecting single-pin symmetries in a single gate, or detecting symmetries among the primary inputs of a logic network. But such a limitation makes it difficult to recognize the very desirable, large multi-gate symmetries, such as those shown in FIGS. 2 and 3. Such symmetries will be detected if an input boundary is chosen that passes through the pins in question, but there are an exponentially increasing number of such boundaries as the point of analysis is moved backwards through a circuit.

In contrast, the present invention focuses on the recognition of large multi-gate input equivalences in a combinational logic circuit. Rather than examining a fixed input boundary, the present invention proceeds by looking for extensible symmetric logic functions (such as AND, OR, and XOR functions) within and between gates in a logic circuit. Such functions are grown backwards as long as they can continue to be extended.

A key idea in understanding the approach of the present invention is that of a disjoint-support decomposition of a Boolean function. This concept recently been the subject of key theoretical work by Damiani and Bertacco in the following two articles: Damiani and Bertacco, "the disjunctive decomposition of logic functions", International Workshop on Logic Synthesis, Tahoe City, Calif., May 1997, Session 8 and Bertacco and Damiani, "Boolean function representation based on disjoint-support decompositions," Proceedings of the IEEE International Conference on Computer Design, October 1996.

The articles by Damiani and Bertacco teach that every completely-specified Boolean function $f$ has a ds-prime decomposition (defined below) that is unique up to negation and permutation of inputs to the various functions in the decomposition. An effective method to compute a ds-prime decomposition from a binary decision diagram (BDD) representing the function is disclosed.

For example, let $f$ be a completely-specified Boolean function of several variables, $f(a_1, a_2, a_3, \ldots, a_n)$. The support of $f$ is the set of input variables on which $f$ depends. Thus, $a_i$ is in the support of $f$ if it is an input variable of $f$ such that there is some setting of the remaining variables for which $$f(a_1, \ldots, a_{i-1}, 0, a_{i+1}, \ldots a_n) \neq$$

$$f(a_1, \ldots, a_{i-1}, 1, a_{i+1}, \ldots a_n).$$

The support of $f$ may be written $S_F$. If $f$ is decomposed into sub-functions, $f=G (A(a_1, a_2, \ldots, a_A), B(a_{A+1}, a_{A+2}, \ldots, a_B), \ldots)$, then its support is generally taken to be the union of the supports of all the sub-functions, assuming non-redundancy. Two functions are disjoint-support if the intersection of their supports is the null set. A decomposition $f=G (A, B, \ldots)$ is a disjoint-support decomposition if all of the sub-functions $A, B, \ldots$ are pair-wise disjoint-support. these sub-functions may likewise be decomposed into disjoint-support functions, etc.

A Boolean function $f$ may be said to be ds-prime if no disjoint-support decomposition into simpler functions exists. Examples of ds-prime functions are MUX(a,b,s) and MAJORITY(a,b,c). A ds-prime decomposition of a Boolean function $f$ is a recursive disjoint-support decomposition such that each function of two or more variables in the decomposition is either a maximally-wide AND, OR or XOR, or a ds-prime function.

Figure 4:
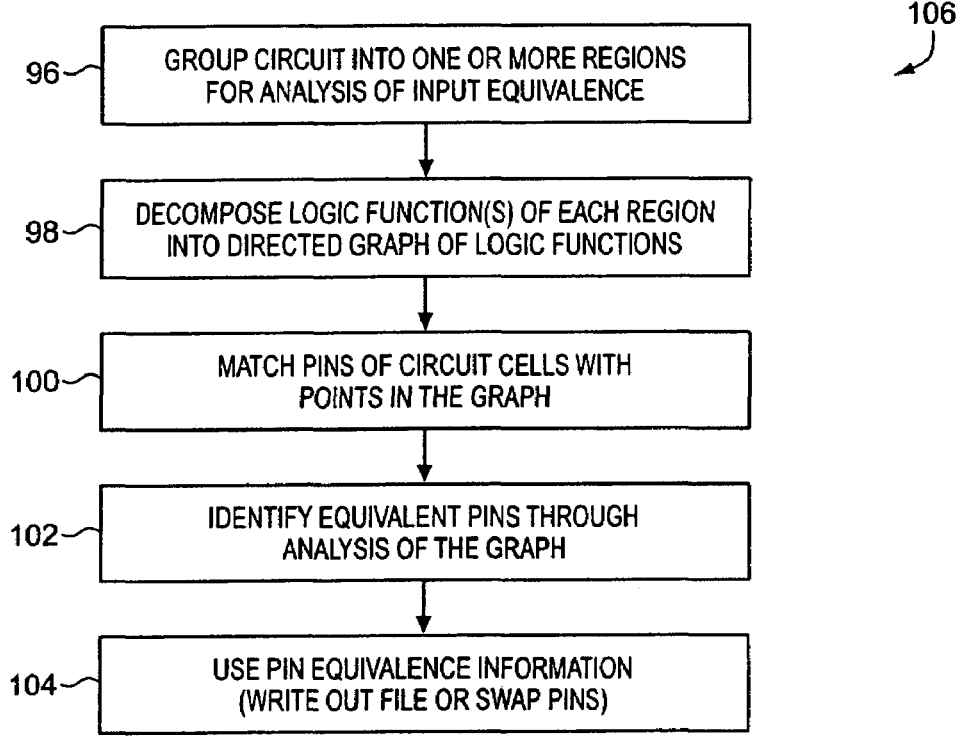
FIG. 4 is a simple flow chart of the major steps of the operation of the present invention.
Figure 5:
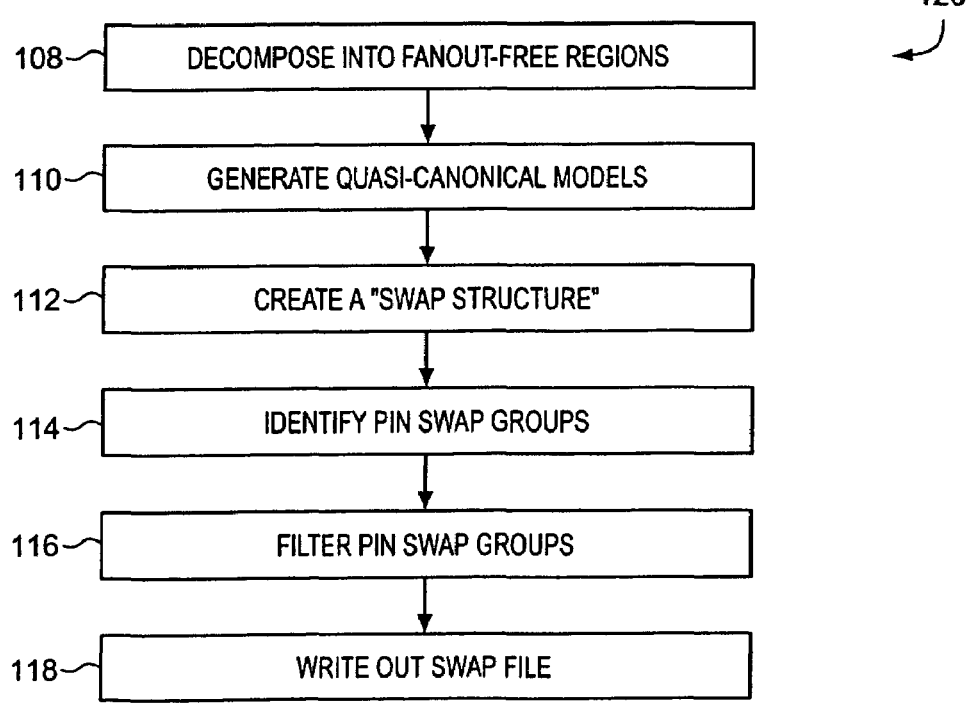
FIG. 5 is a more detailed flow chart showing how these steps are carried out in the preferred embodiment of the present invention.

Referring now to FIGS. 4 and 5, in accordance with the present invention, input equivalence recognition is accomplished in five primary steps.

The first step (96) in the operation of the present invention is to group the circuit into one or more regions for the subsequent analysis. In the preferred embodiment, this is accomplished through the step 108 of decomposing the circuit into fanout-free regions. This step of decomposing the circuit into fanout-free regions will be described in more detail in the detailed description of the preferred embodiment below.

The second step (98) in the operation of the present invention is to decompose the logic function of each of the regions computed in the first step into a directed graph of logic functions, in which each node computes a specified logic function of the values on its incident arcs. In the preferred embodiment, this step is accomplished through the steps of generating quasi-canonical models for the cells in the circuit (110) and creating a swap structure (112) as described below. The swap structure is the directed graph referred to in this second step, with additional information annotated as described below.

The third step (100) in the operation of the present invention is to match the pins of the cells in the circuit with points in the directed graph computed in the second step. In the preferred embodiment, this step is accomplished during the creation of the swap structure 112 by annotating this information during the construction of the swap structure as described in the detailed description below.

The fourth step (102) in the operation of the present invention is to identify equivalent pins through analysis of the graph created in steps two or three. In the preferred embodiment, this step is accomplished by identifying (114) and filtering (116) pin swap groups through analysis of the swap structure, as described below.

The fifth step (104) in the operation of the present invention is to use the pin equivalence information generated in the fourth step. This information may be used either directly by the same program that generates the information, or communicated to a subsequent program, such as a placement or routing tool, by means such as writing to a file or communicating over a share communication channel. In the preferred embodiment, this step is accomplished writing the filtered swap group to a file.

Each of these steps in the preferred embodiment is described in more detail below.

Referring now to FIG. 6, circuit 122 is used as a simple example to help define fan-free regions which are used to help simplify the generation of input equivalences. Circuit 122 includes three inputs, two separate and one common input applied to a pair of inputs gates 124 and 126, the outputs of which are applied to the inputs of a third gate 128, output 138 of which may be fanned to a plurality of other logic gates and destinations.

A fanout-free region has the following properties:

1. It is headed by a single gate in the circuit, which may fan out to multiple places.

2. All other gates are members of the region if they have only one fanout, and this fanout is also a member of the region.

3. Input nets to the region may fan out to multiple input pins in the region.

A logic circuit describable by logic circuit diagram 122 qualifies as a fanout-free region in that it is headed by a single output gate, gate 128, the output 130 of which may fanout to multiple places. The other gates in the region, gates 124 and 126, have only one fanout or output which is applied to gate 128 within the region. The input nets to the region may fan out to multiple input pins in the region, that is, the four inputs to gates 124 and 126 are provided by three separate inputs.

These rules permit equivalences for gates within the region to be generated without being concerned about the surrounding circuitry. Because there is only one point of observability (at output 130 of head gate 128 of circuit region 122), any transformation of the netlist, that is swapping of the pins, within region 122 that leaves the logic function generated by the head gate 128 unchanged and can not affect the rest of the circuit. Each input pin to the region 122 is treated as a distinct input variable, even though multiple pins may be driven by a single input net to the region.

It is therefore not necessary to consider logical relationships between the input pins of the region. As a result of this treatment, plus the restriction of internal gates to a single fanout, gates 124, 126 and 128 of region 122 comprise a decomposition of the function computed at the head gate 128.

A fanout-free region (FFR) is a set of one or more combinational gates in a logic circuit, one of which may be distinguished as the head gate. Each combinational gate in the circuit is a member of exactly one fanout-free region. A combinational gate in a logic circuit is the head of a fanout-free region if either it has more than one fanout or it has a single fanout that is a primary output of the circuit or a non-combinational gate in the circuit.

Note that the number of fanouts is computed over all the fanouts of a gate. Thus a combinational gate with more than one output (such as a combined buffer-inverter cell) would have more than one fanout, unless all but one output was left unconnected in the circuit. A combinational gate that has a single fanout that is also a combinational gate is a member of the same fanout-free region is the gate that it fans out to.

A combinational gate with no fanouts is normally a circuit error. Normally all such gates would be removed from the circuit before fanout-free regions are generated. However, if it is desirable to make the algorithm work even in the presence of such errors, it is possible to treat such gates as belonging to a special fanout-free region that is not otherwise processed for logic equivalence. Such a region would not have a head gate, i.e., head=NULL.

Under these definitions, the combinational gates of the circuit are partitioned into the fanout-free regions. Fanout-free regions can be extended to include combinational sub-functions of non-combinational gates. One example is a multiplexed flip-flop or MUXDFF which is a combinational MUX with a sequential flip-flop.

Two recursive algorithms for identifying fanout-free regions follow naturally from these definitions. Algorithm no. 1 works forwards in the circuit, labeling the gates as they are encountered. The presently preferred algorithm is algorithm no. 2 which works backwards identifying gates that are the head of the regions, and then collecting the remaining gates in that region.

The following pseudo-code outlines are intended as examples of the type of algorithms that can be prepared for analyzing circuits to identify fanout free regions. Explanations of the functions in each code sequence are provided following the pseudo-code description for each algorithm.

```
Algorithm 1.
For each gate G in the circuit:
If G is combinational, add_gate_to_ffr(G, find_ffrl(G))
End
find_ffrl(G);
    If G is labeled, return label(G); EndIf
    If G has one fanout and fanout (G) is combinational,
    /* G is a member, but not the head of the FFR */
        Then regions_label = find_ffrl(fanout(G))
    Else If G has no fanouts,
    /* Error case - Omit if circuit has no such gates */
        Then region_label = NULL,
    Else region_label = name(G);
        EndIf
        /* G is the head of a new region */
        Label G with region_label
        Return region_label;
```

The following explanation is intended to further enhance the largely self-explanatory function names in the pseudo-code above.

"add_gate_to_ffr(gate) region_label" adds the designated gate to the fanout-free region designated by "region_label" in a data structure identifying all of the gates in each region (either a list of lists of gates, or a hash table of indexed by the "region_label", returning a list of gates in that region).

"label(G)" returns the label (if any) attached to gate G.

"name(G)" returns the unique name of gate G (which will be used as a region_label).

"fanout(G)" returns the unique gate that G fans out to (assuming that G has only one fanout).

```
Algorithm 2:
For each gate G in the circuit:
    If G is combinational
    Then If G has >1 fanouts or fanout(G) is not combinational
        /* G is head of new region */
        ffr = new_ffr(name G));
add_gate_to_ffr_with_fanins(G, ffr); add_ffr_to_ffrset(ffr):
        Else If G has no fanouts
            /* Error Case */
            ffr = new_ffr (NULL);
            add_gate to_ffr_with fanins(G, ffr);
            add_ffr_to_ffrset(ffr);
        EndIf /* Skip gates that are not heads of regions */
End If
End
add_gate to_ffr_with_fanins(G, ffr)
    add_gate_to_ffr2(G, ffr);
    For each fanin G1 of G;
        If G1 is combinational and has 1 fanout /* G */
        /* Gate is part of region (Def 3) */
            add_gate_to_ffr_with_fanins(G1, fir);
        EndIf
    End
```

The following explanation is intended to further enhance the largely self-explanatory function names in the pseudo-code above.

"new_ffr" creates a new, empty FFR with the given name.

"add_gate_to_ffr2" adds the given gate to the specified FFR.

"Add_ffr_t_ffrset" adds the completed FFR to the set of all FFRs (represented as a hash table or list of lists—this corresponds to the data structure built by add_gate_to_ffr in Algorithm 1.

The next tasks required are to discover maximally large symmetric functions (AND, OR, XOR) within this decomposition because the inputs to such a symmetric function can then be rotated freely without affecting the rest of the region. One exception to this is that such rotations can affect the genealogical constraints in some circumstances.

This approach does miss possible swaps that span fanout-free regions or that depend on the logical relations between inputs to a region. One example of this is an inverter/MUX combination that implements an XOR function. Such swaps could be detected by analyzing a ds-prime decomposition of the region's function, generated by the algorithm described by Damiani and Bertacco as discussed above.

Once a fanout-free region netlist, or other type of circuit description, is generated, it is necessary to transform the netlist into a quasi-canonical form, defined n more detail herein below.

Many conventional synthesis tools, such as Autologic II from Mentor Graphics, and Leonardo from Exemplar Logic, use netlists of primitive gates to model the functionality of an ASIC library gate. These primitive gates include functions such as AND, OR XOR, NAND, NOR, NOT, BUF, MUXA, etc. The set of primitives is rich enough that most ASIC library cells are typically represented with a netlist that constitutes a recursive disjoint support decomposition of the cell function, although this is not guaranteed. If such a representation is not available (e.g., for FPGA lookup tables), it could be generated using a ds-prime decomposition algorithm.

A fanout-free netlist of primitives (and if not fanout-free, it can be made fanout-free by replicating sections that fan out), can be transformed into a quasi-canonical form (QCF) by moving inverters through AND/OR/XOR functional units, merging adjacent AND/OR/XOR primitives of the same type, and sorting fan-ins. As the name suggests, such a form is not guaranteed to be canonical, but most disjoint-support representations of common ASIC gates will lead to the same result. Indeed, the unique ds-prime decomposition theorem suggests that starting from a disjoint support network, the results will differ only in the ordering and negation of inputs to nodes other than AND/OR/XOR, and in the possible decomposition of such nodes if they are not ds-prime functions.

The QCFs for both the true and complemented versions of the logic function are computed the first time any library cell is encountered in an input-equivalence computation. These are then stored on the cell for easy reference the next time that cell is encountered.

The conversion of a netlist for fanout-free region into quasi-canonical form requires control load inverter placement, the merging of adjacent nodes, and the sorting of inputs.

To standardize the placement of inverters within a quasi-canonical form, the following rules may be used:

All instances of NAND, NOR, or XNOR primitives are replaced by AND, OR or XOR, respectively, followed by and inverter.

An inverter at the input of an XOR function is moved forwards through the function to its output.

An inverter at the output of an AND or OR function is moved backwards through the function to all its inputs (and the function is then converted to the opposite type), using DeMorgan's Law. In the event that both this and the XOR movement rule apply, the XOR rule takes priority.

Two consecutive inverters cancel.

These rules for inverter placement are designed to ensure that the movement of inverters is not ambiguous, and to maximize the chances of being able to merge identical functions after inverter movement.

Merging of adjacent nodes may be controlled as follows. If two functions are the same function from {AND, OR, XOR} and one of them is an input to the other, the two functions are merged into a larger function.

The inputs to the functions AND, OR and XOR are sorted in the following manner: sub-functions (including NOT) come before pins. Pins are sorted alphabetically within themselves. Sub-functions are represented as a list, with the first element being the function name, and subsequent elements being the inputs to the function (already sorted). Sub-functions are sorted lexicographically, sorting first on the name of the function, and then comparing element by element.

These steps should ensure that the resulting quasi-canonical form is consistent for a wide variety of initial models. For example, a 3-input NOR gate with inputs a, b, and c will generate a QCF of: (AND (NOT a) (NOT b) (NOT c)), regardless of whether the initial model was a single NOR primitive, an OR followed by an inverter, two 2-input ORS followed by an inverter, and AND preceded by input inverters, or many other forms.

QCFs are generated by recursive descent from each output port of the library gate, for both true and complemented forms of the output function. Although the above steps are presented separately to explain them more clearly, the actual coding for a working embodiment may conveniently overlap all three operations.

The composition of QCFs from different logic gates follows much the same rules as generation of the QCFs in the first place. The goal is to propagate inversions through AND, OR, and XOR functions in the composed structure, and to merge similar functions together into a larger function. It is desirable to explicitly keep track of gate pins, their polarities, and ancestry relationships, so that the inherent symmetries of the composed "swap structure" to generate swap groups among the pins.

In this swap structure, several properties of the pins are tracked:

The Polarity of the pin: i.e. whether inverted or non-inverted,

Whether the pin is an external gate pin or an internal point within a single function, Whether the pin (if external) fans out to more than one point within the QCF of its gate (only used points count here, so unconnected output pins do not contribute to this fanout).

The parent pin (if any) within the same level of the swap structure.

The input function, if not from the same level of the swap structure.

The gate and pin name cross references, for external pins.

The swap structure is built up by a quasi-breadth-first search from the root gate of the FFR. The non-inverted QCF of the root gate is used; subsequent gates supply either the non-inverted or inverted QCFs depending on the polarity of the external pin they connect to within the swap structure. As each gate is processed, the appropriate QCF is merged into the existing swap structure. External pins without multiple fanouts that connect to AND/OR/XOR functions in the swap structure are candidates for extension of that function.

If the appropriate QCF of the driving gate has the same function at its head, it will be merged with the function at that level of the swap structure. If the QCF has a buffer or inverter at the head, the inverter propagation rules will be applied before merging. If the QCF is only a buffer/Inverter, the input pin will definitely be merged. Otherwise, the QCF will be incorporated as one or more separate swap structure functions.

Referring now to FIG. 7, circuit 132 is shown in a schematic form. The gate components and interconnection of the gates of circuit 132 will be described first, the pin properties for an initial swap structure will then be shown in Table 1, and the resulting swap structure will then be described in with reference to FIG. 8.

Three input NAND gate G1 is the head gate of the fanout free region shown in circuit 132 and provides circuit output 134. Input A of gate G1 at pin P1 is provided by the output of two input NAND gate G2. Input A of gate G2 is provided at pin P15. Input B of gate G2 is provided at pin P16 by the output of three input NAND gate G8. Inputs A, B, and C of gate G8 are provided by pins P17, P18, and P19, respectively.

Input B of gate G1 is provided at pin P2 by the output AND-OR-INVERT gate G3. This gate computes the function (NOT (OR (AND AB) (AND CD))), where inputs A, B, C, and D are provided by pins P20, P21, P22, and P23, respectively. For convenience, internal points of the gate computing the sub-functions (AND A B) and (AND C D) are labeled P4 and P5, respectively. These internal points need not correspond to any action points in the physical implementation of gate G3.

Input C of gate G1 is provided at pin P3 by the output of three input NOR gate G4. Input A of gate G4 is provided by the output of two input NOR gate G5. Input A of gate G5 is provided at pin P9 while input B of gate G5 is provided at pin P10. Input B of gate G4 is provided at pin P7 by the output of inverting buffer G6, the input of which is provided at P11 by the output of two input multiplexer G9. Input A gate G9 is provided at pin P24 while input B of gate G9 is provided at input pin P25. Multiplexing input S is provided pin P26.

Input C of gate G4 is provided by the output of three input NAND gate G7, inputs A, B and C of which are provided at pins P12, P13 and P14 respectively.

The algorithm starts with gate G1. Since this is the initial gate, the positive QCF: (OR (NOT A) (NOT B) (NOT C) is used to build the initial function of the swamp structure, an OR with pins 1, 2, and 3. The initial values of the pin properties are shown in the following Table.

TABLE 1

Pin Properties for Initial Swap Structure

| Pin ID | Gate | Pin | Inv.? | Ext.? | Fanout | Parent | Input |
|---|---|---|---|---|---|---|---|
| Function 1: OR, non-inverted | | | | | | | |
| 1 | G1 | A | Y | Y | | -1 | |
| 2 | G1 | B | Y | Y | | -1 | |
| 3 | G1 | C | Y | Y | | -1 | |

Next the external pins of the function are expanded in order, until there are no more pins to expand. Expansion consists of looking at the driving cell for that pin (if part of the same FFR) and incorporation the QCF of that cell into the swap structure. In an actual implementation, pin Ids are typically only unique within a single function of the swap structure. For ease of explanation, every pin shown in these figures is given a unique ID.

The first pin to be expanded is pin P1. Since this is an inverted pin, the negative QCF of G2: (AND A B) is used. Since AND is different for OR, no merge takes place, and the AND is introduced as a separate function. The pin values now are:

TABLE 2

Pin Properties after expanding Pin 1

| Pin ID | Gate | Pin | Inv.? | Ext.? | Fanout | Parent | Input |
|---|---|---|---|---|---|---|---|
| Function 1: OR, non-inverted | | | | | | | |
| 1 | G1 | A | Y | Y | | -1 | 2 |
| 2 | G1 | B | Y | Y | | -1 | |
| 3 | G1 | C | Y | Y | | -1 | |
| Function 2: AND, non-inverted | | | | | | | |
| 15 | G2 | A | N | Y | | -1 | |
| 16 | G2 | B | N | Y | | -1 | |

Because function 2 is a separate function, it is not necessary to keep track of the parent pin ID for pins 15 or 16: this is only used to track the genealogical relationships within a single function in the swap structure. The next pin to be expanded is pin 2. This too is an inverted pin, so the inverted QCF of G3: (OR (AND A B) (AND C D)) is used. The OR function does match the current function, so this top-level function is merged into the current function, producing the pin property shown in Table 3.

TABLE 3

Pin Properties after expanding Pin 3

| Pin ID | Gate | Pin | Inv.? | Ext.? | Fanout | Parent | Input |
|---|---|---|---|---|---|---|---|
| Function 1: OR, non-inverted | | | | | | | |
| 1 | G1 | A | Y | Y | | -1 | 2 |
| 2 | G1 | B | Y | Y | | -1 | |
| 3 | G1 | C | Y | Y | | -1 | |
| 4 | G3 | | N | N | | 2 | 3 |
| 5 | G3 | | N | N | | 2 | 4 |
| Function 2: AND, non-inverted | | | | | | | |
| 15 | G2 | A | N | Y | | -1 | |
| 16 | G2 | B | N | Y | | -1 | |
| Function 3: AND, non-inverted | | | | | | | |
| 20 | G3 | B | N | Y | | -1 | |
| 21 | G3 | A | N | Y | | -1 | |
| Function 4: AND, non-inverted | | | | | | | |
| 22 | G3 | C | N | Y | | -1 | |
| 23 | G G32 | D to | N | Y | | -1 | |

Referring now to FIG. 7, after all the external pins have been expanded for all functions, the resulting pin properties are as shown in Table 4.

TABLE 4

Pin Properties after expanding all Pins

| Pin ID | Gate | Pin | Inv.? | Ext.? | Fanout | Parent | Input |
|---|---|---|---|---|---|---|---|
| Function 1: OR, non-inverted | | | | | | | |
| 1 | G1 | A | Y | Y | | -1 | 2 |
| 2 | G1 | B | Y | Y | | -1 | |
| 3 | G1 | C | Y | Y | | -1 | |
| 4 | G3 | | N | N | | 2 | 3 |
| 5 | G3 | | N | N | | 2 | 4 |
| 6 | G4 | A | N | Y | | 3 | |
| 7 | G4 | B | N | Y | | 3 | |
| 8 | G4 | C | N | Y | | 3 | |
| 9 | G5 | A | N | Y | | 3 | |
| 10 | G5 | B | N | Y | | 6 | |
| 11 | G6 | A | Y | Y | | 7 | 5 |
| 12 | G7 | A | Y | Y | | 8 | |
| 13 | G7 | B | Y | Y | | 8 | |
| 14 | G7 | C | Y | Y | | 8 | |
| Function 2: AND, non-inverted | | | | | | | |
| 15 | G2 | A | N | Y | | -1 | |
| 16 | G2 | B | N | Y | | -1 | |
| 17 | G8 | A | N | Y | | 16 | |
| 18 | G8 | B | N | Y | | 16 | |
| 19 | G8 | C | N | Y | | 16 | |
| Function 3: AND, non-inverted | | | | | | | |
| 20 | G3 | B | N | Y | | -1 | |
| 21 | G3 | A | N | Y | | -1 | |
| Function 4: AND, non-inverted | | | | | | | |
| 22 | G3 | C | N | Y | | -1 | |
| 23 | G3 | D | N | Y | | -1 | |
| Function 5: MUX, non-inverted | | | | | | | |
| 24 | G9 | A | N | Y | | -1 | |
| 25 | G9 | B | N | Y | | -1 | |
| 26 | G9 | S | N | Y | | -1 | |

Figure 8:
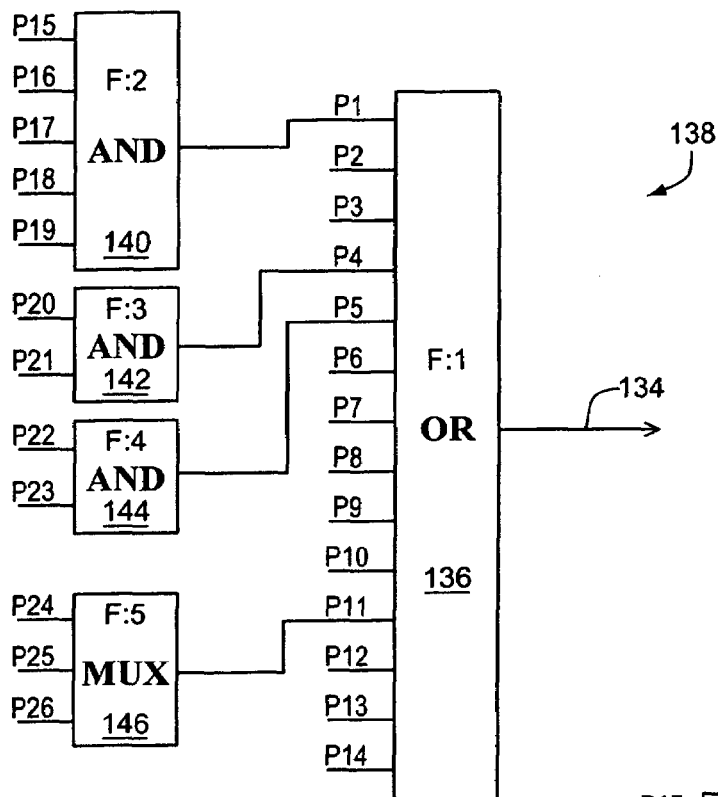
FIG. 8 is a swap structure of the circuit shown in FIG. 7 based on the pin properties shown in table 4.

As shown in FIG. 8, the pin properties listed in Table 4 represents a swap structure or simplified circuit, such as swap structure or circuit 138, which can then be analyzed further to recognize pin swapping possibilities.

In particular, swap structure 138 provides output signal 134 as the output of 14 pin, non-inverting OR gate 136 which provides function F1 listed in Table 4. The input to pin P1 of gate 136 is provided by the output of five input, non-inverting AND gate 140, the inputs of which are provided by pins P15, P16, P17, P18, and P19. Gate 140 provides function F1 shown in Table 4. The input to pin P4 of gate 136 is provided by the output of two input non-inverting AND gate 142 which provides function F3 in Table 4. The inputs to gate 142 are provided by pins P20 and P21. The input to pin P5 of gate 136 is provided by the output of Two input AND gate 126 which provides the function F4 in Table 4. The inputs to gate 126 are provided by pins P22 and P23.

In summary, the present technique recognizes multi-gate input equivalences by building up a swap structure for the original netlist:

Which computes the same function as the original netlist,

Which contains points that are identified with the external input pins of gates in that netlist, but Which express the AND, OR, and XOR symmetries that were present in the original netlist in the form of large functional blocks.

The next step is to extract the swap groups from this swap structure. It may be noted that there is a close relationship between the swap structure as constructed above and a ds-prime decomposition of the function. In fact, the example swap structure is a ds-prime decomposition with some additional information added (such as the gate pins that are only used internally to the AND or OR functions). This will not always be the case, due to the limited set of primitives and the occasional reconvergent fanout in the internal logic model of a gate, but the two will generally be quite close. It is expected that an extended ds-prime decomposition could be used as the basis for an input equivalence recognition algorithm.

The swap structure of Table 4 may be analyzed to identify both multi-gate single-pin swaps (MGSP) and multi-pin swaps (MP). The single-gate single-pin swaps (SGSP) are identified using conventional BDD-based methods.

The MGSP swap can be read almost directly out of the swap structure based on the following observation. If two external pins are both inputs to the same (OR, AND or XOR) functional block in the swap structure, do not have multiple fanouts, have the same parity, and are not in an ancestor-descended relationship with each other, then the inputs to those two pins may be swapped without changing the function computed at the output of that functional block.

In particular, if independent input cones to the two points in question within the swap structure are identified by decomposing those parts of the function in question that fan in to the two points, these two input cones become identical (same parity) inputs of a symmetric function.

Accordingly, if these two input cones are swapped, the resultant swap structure computes the same function at the output of the functional block, and therefore (since these input cones fan out nowhere else), computes the same function at the output of the entire FFR.

Figure 9:
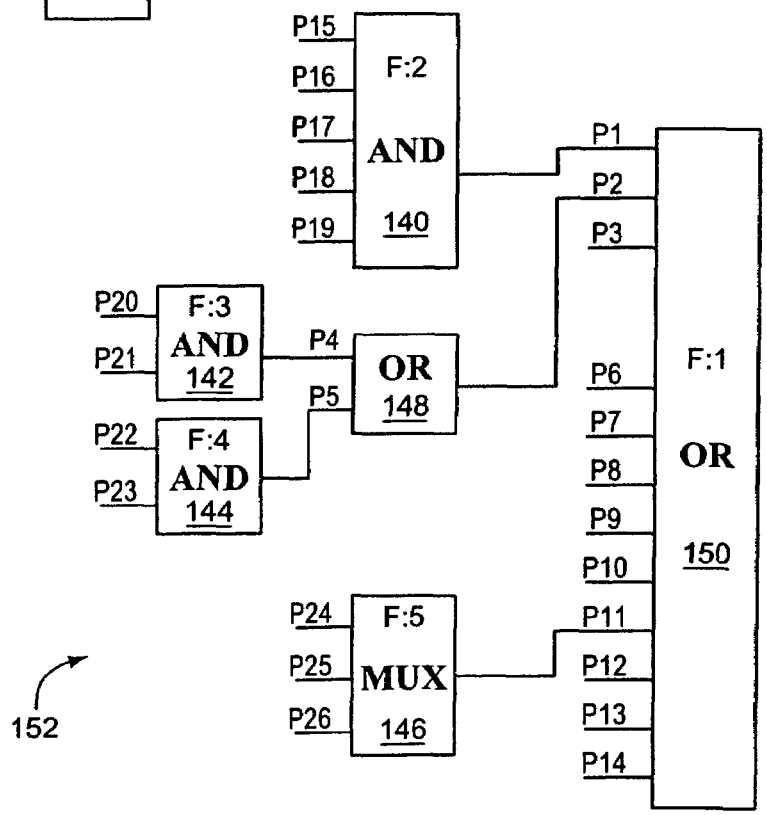
FIG. 9 is a logic schematic of a decomposed swap structure based on the swap structure of FIG. 7.

Referring now to FIG. 9, an example of a decomposed swap structure is shown as circuit 152, justifying the swap of pin P2 of FIG. 8 with any of pins P12-P14. In particular, the outputs of AND gate 142 and AND gate 144 at pins P4 and P5 are applied to two input OR gate 148, the output of which is applied to pin P2.

In this revised swap structure 152, pins P2, P12, P13 and P14 are all terminal inputs with the same polarity to the refactored OR block 150. Therefore, the inputs to these pins may be swapped freely without affecting the output logic function.

Therefore the basic approach to generating MGSP equivalences is to collect all the external pins of the same polarity that are inputs to the same AND, OR, or XOR function in a swap structure, and then filter out multiple fanout pins and those with possible ancestor-descendent relationships. The manner in which the latter must be done depends on the capabilities of the client for this information. If the client is capable of recognizing ancestor-descendent conflicts, then it is possible to output the entire group of pins with the same polarity, and leave it up to the client to deal with.

A more conservative approach is to only use those pins that are not the parent of any other pin in the function output. This ensures that there are no ancestor-descendent relationships among the pins in the group that is output, and subsequent swaps within this group will not change this fact. It is possible to suppress the group if the remaining pins belong to only one gate, such as SGSP equivalences.

The above MGSP swaps do not include internal points such as pins 4 and 5 as shown in FIG. 8 and Table 4, which are not the external pins of some gate. Because all swaps must ultimately be expressed as swaps of external pins, the input function is evaluated to determine if it can be matched with the input function of some other pin (internal or external).

Accordingly, MP swaps are generated by looking for internal pins input to an AND, OR or XOR function in the swap structure, expanding the input function to this pin until it consists entirely of external gate pins, and then looking for a match among the input functions to other pins in the same swap function.

In general, this process may need to be repeated recursively, as an input pin of a potential match might itself be an internal pin of some gate, in which case the input function to this pin must be incorporated to look for a match with the original function, etc. However, most of the potential MP matches are to the internal point of an AND-OR gate. This process can be simplified by only looking for 1-level matches: if a potential match includes an internal point, it is simply skipped. To facilitate this, a "signature" for the top-level gate is recomputed in each swap function, which includes the function, the number of inputs to the top-level gate, and the inversion pattern of the inputs to this gate. Matches are identified by matching this signature.

In the example swap structure 138 shown in FIG. 9, the MP swap process will start with either pin P4 or P5, identify this pin as an internal pin, and look at the signature of the top-level gate of the input function. Next other inputs to the OR structure that are fed by input functions with identical signatures are identified to find pins P1, P4 and P5. This yields a MP swap group with elements: (P15, P16), (P20, P21), and (P22, P23).

Field-programmable Gate Arrays (FPGAs) could benefit form an approach like this even more than Application Specific Integrated Circuits (ASICs), since routing resources are often very, restricted in FPGAs. An approach tailored to FPGAs would take advantage of the ability to modify the logic function of any particular gate more or less freely, especially for lookup-table (LUT) based devices. The following modifications are required:

LUTs may not have pre-defined logic models in netlist form. For example the Damiani/Bertacco algorithm could be used to generate a ds-prime decomposition for an arbitrary LUT used as the starting point for QCF generation.

In interpreting the swap structure, the technique is not constrained to only swap between pins with the same polarity, since the logic function of the gate can be freely changed to introduce or delete inversions (at least for LUT-based FPGAs). Accordingly, larger swap groups will generated that include both polarities, and require the client application performing the swaps to modify the polarity of the input pins appropriately.

Alternate Implementation

Referring back to FIGS. 4 and 5, an alternate implementation of the present invention may be accomplished as follows:

The step 96 of grouping the circuit into regions will consist of forming the fanout regions, as in the preferred embodiment, and then identifying regions that fan out to only one other region and coalescing them together.

The step 98 of decomposing the logic function of each region will be accomplished by constructing a binary decision diagram (BDD) for each output of such coalesced regions, as is well known in the prior art, and then using this BDD to construct a ds-prime decomposition of each such function in terms of the inputs to the region, as taught by the paper of Damiani and Bertacco, and improved by Matsunaga (Yusuke Matsunaga, "An exact and efficient algorithm for disjunctive decomposition", SASIMI98 conference). This ds-prime decomposition is the graph created in this step.

The step 100 of matching the pins of circuit cells with points in the graph will be accomplished by building. BDDs for each arc in the graph created in item 2 and likewise for each net in the original circuit, and comparing these BDDs for equality. When such equality is found, the point corresponding to the head of the arc in the graph structure will be identified with the pin or set of pins driven by the net in the original circuit:

The step 102 of identifying the equivalent pins will be accomplished similarly to the analysis of the swap structure in the preferred embodiment Direct inputs to symmetric functions in the decomposition graph give rise to single-pin equivalences among the corresponding input pins in the circuit. Inputs that have no corresponding input pin may give rise to multiple-pin swap groups if the input functions to such pins match in function type and number of input pins, assuming that each such second (or higher) level input corresponds to an actual pin in the original circuit. The principal difference between the equivalences generated in this implementation and those generated in the preferred embodiment is that the single-pin equivalences generated by this implementation may include a group of two or more pins driven by a single net as a single conceptual "pin" in the decomposition graph that may be swapped with a group that may consist of a different number of pins, also driven by a single net. In this case, swapping the conceptual pins would consist of swapping the nets driving the pins in each group. An example follows below.

The step 104 of using the pin equivalence information will be accomplished in the same manner as in the preferred embodiment.

This implementation can identify certain classes of swaps not identified by the preferred embodiment. However, it is more complex to implement correctly than the preferred embodiment, and it will miss some types of swaps found by the preferred embodiment These factors affect the choice of which constitutes the preferred embodiment.

Figure 10:
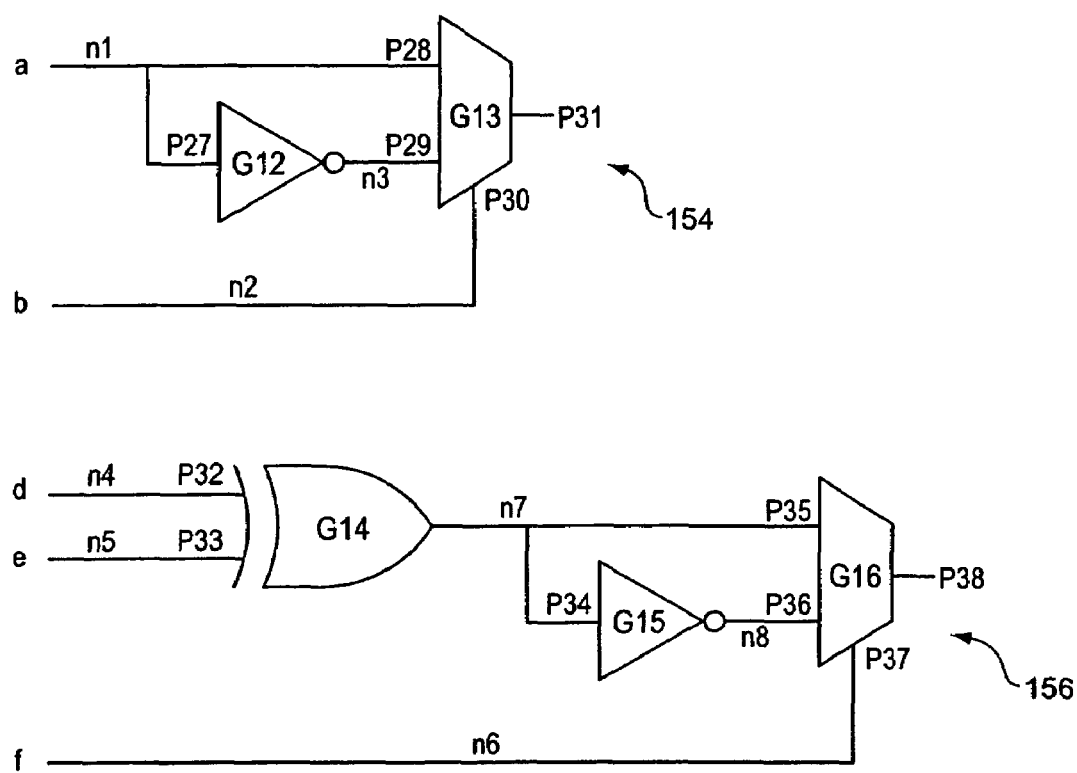
FIG. 10 is a logic schematic showing two circuits that have input equivalences not found by the preferred embodiment, which could be found by an alternate implementation of the present invention.

As an example of a class of swap not identified by the preferred embodiment, consider the circuit 154 shown in FIG. 10. This circuit has two inputs. Input a is connected to net n1, which drives both data input pin P2 of multiplexer G2 and input pin P1 of inverter G1. Inverter G1 drives the other data input pin P3 of multiplexer G2 through net n3. Input b to the circuit is connected to net n2, which drives the select input P4 of multiplexer G2. The output function of this circuit is produced at the output pin P5 of multiplexer G2.

It may be apparent from examining this circuit diagram that this circuit implements an exclusive-or function of the inputs a and b, and thus input nets n1 and n2 may be swapped. This will not be recognized by the preferred embodiment, because the preferred embodiment treats each pin driven by an input as if such a pin was driven by a distinct input from all other pins. The alternate implementation will recognize this circuit as an exclusive-or function (hence symmetric) when it constructs the ds-prime decomposition of the circuit function, which is a two-input XOR function of inputs a and b. In swapping nets n1 and n2, input pins P1 and P2 are treated as a single conceptual-pin as referenced in item 4 discussing step 102 above. After the swap, net n2, will be connected to P2 and P2, and net n1 win be connected to P4.

A second example of a swap not found by the preferred embodiment is shown in circuit 156 in FIG. 10. This circuit has three inputs. Input d is connected to net n4, which drives pin P6 of exclusive-or gate G3. Input e is connected to net n5, which drives pin P7 of exclusive-or gate G3. The output of gate G3 drives input P8 of inverter G4 and also data input P9 of multiplexer G5 through net n7. The output of inverter G4 drives the other data P10 of multiplexer G5 through net n8. The remaining circuit input, f, drives the select pin P11 of multiplexer G5 through net n6. The output of this circuit is produced at the output pin of P12 of multiplexer G5.

This circuit implements a three-input exclusive-or function of the inputs d, e, and f, and thus all three pins P6, P7 and P11 are single-pin input equivalent. This equivalence will not be recognized by the preferred embodiment, because gate G3 will be grouped into a different fanout-free region than gate G4 and G5. The alternate implementation will recognize this equivalence.

Figure 11:
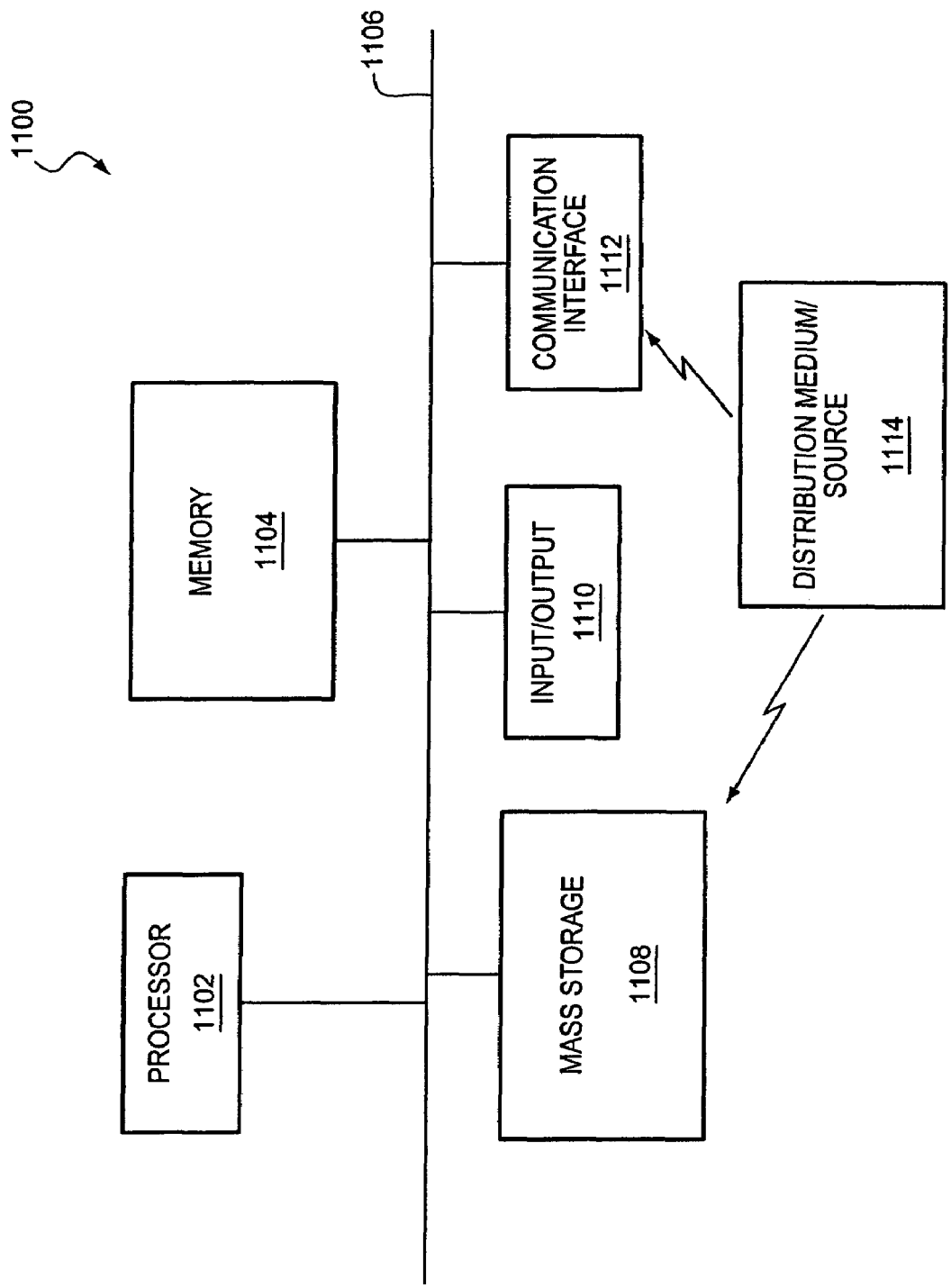
FIG. 11 is a block diagram showing an example computer system suitable for practicing the present invention.

FIG. 11 illustrates one embodiment of a computer system suitable for use to practice the present invention. As shown, computer system 1100 includes processor 1102 and memory 1104 coupled to each other via system bus 1106. Coupled to system bus 1106 are non-volatile mass storage 1108, such as hard disks, floppy disk, and so forth, input/output devices 1110, such as keyboard, displays, and so forth, and communication interfaces 1112, such as modem, LAN interfaces, and so forth. Each of these elements performs its conventional functions known in the art. In particular, system memory 1104 and non-volatile mass storage 1108 are employed to store a working copy and a permanent copy of the programming instructions implementing the above described teachings of the present invention. The programming instructions may be any-programming instructions known in the art, including but not limited to C, C++, Assembler, and so forth. System memory 1104 and non-volatile mass storage 1106 may also be employed to store the IC designs, including the identified equivalents as well as other data. The permanent copy of the programming instructions to practice the present invention may be loaded into non-volatile mass storage 1108 in the factory, or in the field, using distribution source/medium 1114 and optionally, communication interfaces 1112. Examples of distribution medium 1114 include recordable medium such as tapes, CDROM, DVD, and so forth. The constitution of elements 1102-1114 are well known, and accordingly will not be further described.

Having now described the invention in accordance with the requirements of the patent statutes, those skilled in this art will understand how to make changes and modifications in the present invention to meet their specific requirements or conditions. Such changes and modifications may be made without departing from the scope and spirit of the invention as set forth in the following claims. In particular, the characteristics of a fan-out free region, the quasi-canonical form and the swap structure may be varied from implementation without departing from the spirit or scope of the present invention as long as they provide for determining and exploiting input equivalence.

What is claimed is:

1. A computer-implemented method, comprising:
    decomposing a circuit representation into fanout-free regions, each of the fanout-free regions corresponding to at least one logic function and each of the fanout-free regions comprising an output;
    decomposing the at least one logic function of at least one of the fanout-free regions by generating a binary decision diagram for each output of the at least one of the fanout-free regions;
    identifying equivalent pins by matching pins of gates in the circuit representation with points in a ds-prime graph created using the binary decision diagram; and
    using the identified pin equivalence information to determine the input equivalence of the at least one of the fanout-free regions.

2. The computer-implemented method of claim 1, further comprising modifying the circuit representation based at least in part on the determined input equivalence.

3. The computer-implemented method of claim 2, wherein modifying the circuit representation comprises swapping two or more of the pins of the gates in the circuit representation.

4. The computer-implemented method of claim 1, further comprising generating a binary decision diagram for each net in the circuit representation.

5. The computer-implemented method of claim 4, wherein matching pins of gates in the circuit representation with points in the ds-prime graph comprises comparing at least one of the binary decision diagram for each output of the fanout-free regions with at least one of the binary decision diagram for each net in the circuit representation.

6. The computer-implemented method of claim 1, wherein decomposing the circuit representation into the fanout-free regions comprises identifying a region head for each of the fanout-free regions, and wherein the region head comprises a first combinational gate.

7. The computer-implemented method of claim 6, wherein decomposing the circuit representation into the fanout-free regions further comprises identifying at least one non-region-head member for each of the fanout-free regions, and wherein the non-head region member comprises a second combinational gate.

8. The computer-implemented method of claim 1, wherein decomposing the circuit representation into the fanout-free regions comprises forming each of the fanout-free regions and identifying a corresponding region head for each of the fanout-free regions.

9. The computer-implemented method of claim 8, further comprising identifying a sub-plurality of fanout-free regions, wherein each of the sub-plurality of fanout-free regions fans out to only one other fanout-free region.

10. The computer-implemented method of claim 9, further comprising coalescing each of the sub-plurality of fanout-free regions into a coalesced region, wherein the coalesced region comprises a coalesced output.

11. The computer-implemented method of claim 10, wherein the binary decision diagram comprises a coalesced binary decision diagram for the coalesced output.

12. One or more computer-readable media comprising computer-executable instructions which, when executed by a processor, perform a method comprising:
    decomposing a circuit representation into fanout-free regions, each of the fanout-free regions corresponding to at least one logic function and each of the fanout-free regions comprising an output;
    decomposing the at least one logic function of at least one of the fanout-free regions by generating a binary decision diagram for each output of the at least one of the fanout-free regions;
    identifying equivalent pins by matching pins of gates in the circuit representation with points in a ds-prime graph created using the binary decision diagram; and
    using the identified pin equivalence information to determine the input equivalence of the at least one of the fanout-free regions.

13. The one or more computer-readable media of claim 12, wherein the method further comprises modifying the circuit representation based at least in part on the determined input equivalence.

14. The one or more computer-readable media of claim 13, wherein modifying the circuit representation comprises swapping two or more of the pins of the gates in the circuit representation.

15. The one or more computer-readable media of claim 12, wherein decomposing the circuit representation into the fanout-free regions comprises identifying a region head for each of the fanout-free regions, and wherein the region head comprises a first combinational gate.

16. The one or more computer-readable media of claim 15, wherein decomposing the circuit representation into the fanout-free regions further comprises identifying at least one non-region-head member for each of the fanout-free regions, and wherein the non-head region member comprises a second combinational gate.

17. The one or more computer-readable media of claim 12, wherein decomposing the circuit representation into the fanout-free regions comprises forming each of the fanout-free regions and identifying a corresponding region head for each of the fanout-free regions.

18. The one or more computer-readable media of claim 17, wherein the method further comprises identifying a sub-plurality of fanout-free regions, wherein each of the sub-plurality of fanout-free regions fans out to only one other fanout-free region.

19. The one or more computer-readable media of claim 18, wherein the method further comprises coalescing each of the sub-plurality of fanout-free regions into a coalesced region, wherein the coalesced region comprises a coalesced output.

20. The one or more computer-readable media of claim 19, wherein the binary decision diagram comprises a coalesced binary decision diagram for the coalesced output.

* * * * *

UNITED STATES PATENT AND TRADEMARK OFFICE
CERTIFICATE OF CORRECTION

PATENT NO.         : 7,398,490 B2                                              Page 1 of 1
APPLICATION NO.    : 11/330676
DATED              : July 8, 2008
INVENTOR(S)        : David E. Wallace It is certified that error appears in the above-identified patent and that said Letters Patent is hereby corrected as shown below:

On the title page

Page 2, item 56, column 1,
Cong citation, "an dLogic Dependcy" should be --and Logic Dependency--.
Choy citation, "Enironment, IEEE Tranactions on Cmputers" should be --Environment, IEEE Transactions on Computers--.

In the claims

Column 17,
Line 36, "diagram" should be --diagrams--.
Line 37, "diagram" should be --diagrams--.

Signed and Sealed this
Eighth Day of December, 2015

Michelle K. Lee
*Director of the United States Patent and Trademark Office*